United States Patent [19]

Harvey et al.

[11] Patent Number: 5,411,897
[45] Date of Patent: May 2, 1995

[54] MACHINE AND METHOD FOR APPLYING SOLDER PASTE TO ELECTRONIC DEVICES SUCH AS SOLAR CELLS

[75] Inventors: David S. Harvey, Groton, Mass.; Scott E. Danielson, Evanston, Ill.; John W. Dacey, Stoneham, Mass.

[73] Assignee: Mobil Solar Energy Corporation, Billerica, Mass.

[21] Appl. No.: 191,622

[22] Filed: Feb. 4, 1994

[51] Int. Cl.6 .................. H01L 31/18; B23K 3/00
[52] U.S. Cl. ......................... 437/8; 136/256;
  437/2; 437/180; 228/102; 228/179.1; 228/8;
  228/49.5
[58] Field of Search ............... 228/102, 105, 179.1,
  228/180.1, 180.21, 180.5, 8, 49.5, 56.5, 58, 901;
  136/244, 256; 437/2-5, 8, 180

[56] References Cited

U.S. PATENT DOCUMENTS

| | | | |
|---|---|---|---|
| 3,997,123 | 12/1976 | King | 242/56 R |
| 4,451,969 | 6/1984 | Chaudhuri | 43/2 |
| 4,534,502 | 8/1985 | Piurek | 228/102 |
| 4,609,565 | 9/1986 | Yates | 437/2 |
| 4,751,191 | 6/1988 | Gonsiorawski | 437/2 |
| 5,010,040 | 4/1991 | Vayman | 437/230 |
| 5,074,920 | 12/1991 | Gonsiorawski | 136/244 |
| 5,151,377 | 9/1992 | Hanoka et al. | 437/2 |
| 5,151,386 | 9/1992 | Bottari | 437/187 |
| 5,328,520 | 7/1994 | Itagaki | 136/256 |

FOREIGN PATENT DOCUMENTS

| | | | |
|---|---|---|---|
| 2215129 | 12/1990 | United Kingdom | 136/256 |
| WO89/12321 | 12/1989 | WIPO | 136/256 |
| WO92/02952 | 2/1992 | WIPO | 136/256 |

Primary Examiner—Aaron Weisstuch
Attorney, Agent, or Firm—Pandiscio & Pandiscio

[57] ABSTRACT

A machine and method are provided for applying a solder paste to a solar cell or other semiconductor device. The machine comprises (1) a conveyor means having at least one cell-holding means for holding a photovoltaic solar cell, (2) drive means for moving the conveyor means stepwise so as to shift said cell-holding means in turn from a first cell loading position to a second cell pasting position and then to a cell unloading position, (3) selectively operable solder paste dispensing means for applying solder paste to a cell located at said second cell pasting position, (4) means for selectively operating said drive means and said paste dispensing means so as to (a) convey a cell from said loading position to said cell pasting position, (b) cause said paste-dispensing means to dispense solder paste onto a cell in said cell pasting position, and (c) convey the cell with the dispensed solder paste from said cell pasting position to said cell unloading position.

Preferably, but not necessarily, the machine comprises two paste dispensing assemblies disposed so that solder paste may be dispensed simultaneously onto the front and back sides of a solar cell.

35 Claims, 6 Drawing Sheets

MACHINE AND METHOD FOR APPLYING SOLDER PASTE TO ELECTRONIC DEVICES SUCH AS SOLAR CELLS

This invention relates to the art of applying solder paste to electrical devices for interconnecting same to other components, and more particularly to the art of interconnecting photovoltaic solar cells.

BACKGROUND OF THE INVENTION

The manufacture of photovoltaic solar cells involves provision of semiconductor substrates in the form of sheets or wafers having a shallow p-n junction adjacent one surface thereof (commonly called the "front surface"). Such substrates, which may include an insulating anti-reflection ("AR") coating on their front surfaces, are commonly referred to as "solar cell blanks". The anti-reflection coating is transparent to solar radiation. In the case of silicon solar cells, the AR coating is often made of silicon nitride or an oxide of silicon or titanium.

A typical solar cell blank may take the form of a rectangular EFG-grown polycrystalline silicon substrate of p-type conductivity having a thickness in the range of 0.008 to 0.018 inches and a p-n junction located about 0.5 microns from its front surface, and also having a silicon nitride coating about 800 Angstroms thick covering its front surface. Equivalent solar cell blanks also are well known, e.g. those comprising single crystal silicon substrates and cast polycrystalline silicon substrates.

The solar cell blanks are converted to finished solar cells by providing them with electrical contacts (sometimes referred to as "electrodes") on both the front and rear sides of the semiconductor substrate, so as to permit recovery of an electrical current from the cells when they are exposed to solar radiation. These contacts are typically made of aluminum, silver, nickel or other metal or metal alloy. A common arrangement is to provide silicon solar cells with rear contacts made of aluminum and front contacts made of silver.

The contact on the front surface of the cell is generally in the form of a grid, comprising an array of narrow fingers and at least one elongate bus (also hereinafter called a "bus bar") that intersects the fingers. The width and number of the fingers and busses are selected so that the area of the front surface exposed to solar radiation is maximized. Further to improve the conversion efficiency of the cell, an AR coating as described overlies and is bonded to those areas of the front surface of the cell that are not covered by the front contact.

The rear contact may cover the entire rear surface of the solar cell blank, but more commonly it is formed so as to terminate close to but short of the edges of the blank. Aluminum is preferred for the rear contact for cost and other reasons. However, the exposed surface of an aluminum contact tends to oxidize in air, making it difficult to solder a wire lead to the contact. Therefore, to facilitate soldering, it has been found useful additionally to provide apertures in the aluminum coating, with silver soldering pads being formed in those apertures so as to slightly overlap the adjacent aluminum layer. The silver pads form ohmic bonds with the underlying substrate and also low resistance electrical connections with the aluminum contact, and are used as sites for making soldered connections to the rear contact. The silver soldering pads are considered to be an integral part of the rear contact. Such a contact arrangement is disclosed in PCT International Publication No. WO 92/02952, based on U.S. patent application Ser. No. 07/561,101, filed Sep. 1, 1990 by Frank Bottari et al for "Method Of Applying Metallized Contacts To A Solar Cell". An alternative but similar back contact arrangement wherein the aluminum coating has apertures filled with silver soldering pads involves having the aluminum overlap the edges of the silver soldering pads.

The grid-shaped contact and the AR coating on the front surface may be formed in various ways, as exemplified by U.S. Pat. Nos. 4,451969, 4,609,565, 4,751,191, 5,010,040, 5,074,920, British Patent No. 2,215,129, and PCT International Application WO 89/12321, published 14 Dec. 1989.

Regardless of how the front grid contact and the AR coating are formed, at least a portion of each bus of the front contact is not covered with the AR coating, so as to permit making a soldered connection to that contact.

Photovoltaic solar cells (e.g., silicon solar cells) are typically small in size, e.g., 2–4 inches on a side, with the result that their power output also is small. Hence, industry practice is to interconnect a plurality of cells so as to form a physically integrated module with a correspondingly greater power output, and then several such modules are in turn assembled and interconnected to form a solar panel. Several solar panels may be connected together to form a larger array. The cells in a module are electrically connected in parallel and/or in series, and two or more modules in a panel may be connected in series or in parallel, depending on the voltage and current output that is desired from the panel.

A common practice is to use copper wire, preferably in the form of strips of flat copper ribbon, to interconnect a plurality of cells in a module, with each ribbon being soldered to the front or back contact of a particular cell by means of a suitable solder paste, e.g., a solder paste as described in U.S. Pat. No. 5,074,920. The solder paste is deposited onto the contacts at ambient temperatures, preferably as discrete small daubs, and then with a copper ribbon contacting it, each daub is heated just enough, preferably by exposure to hot air, to drive off the fluxing agent and cause the metal components of the solder to fuse to the copper ribbon and the underlying solar cell contact.

OBJECTS AND SUMMARY OF THE INVENTION

The primary object of this invention is to provide an improved apparatus and method for applying solder paste to an electrical component or device so as to facilitate connecting electrically conductive wires to that component or device by soldering the same together.

Another object is to provide a novel method and apparatus for applying solder paste to the contacts of a solar cell or other electronic device characterized by use of means for detecting whether or not solder paste has been applied successfully to the contacts.

Another object is to provide an improved method and apparatus for applying solder paste to multiple sites simultaneously. A further object is to provide an improved apparatus and method for applying solder paste to selected sites on the front and/or back sides of an electronic substrate, e.g., to selected areas of the front and back contacts of thin photovoltaic solar cells.

A further object is to provide an improved method and apparatus for applying solder paste to thin, brittle substrates in a way that avoids subjecting the substrates to excessive bending and shear stresses that will cause the substrates to break.

These objects, and other objects rendered obvious by the following detailed description, are achieved by providing a machine which comprises (1) a conveyor having at least one cell-holding means for holding a photovoltaic solar cell, (2) drive means for indexing the conveyor so as to shift said cell-holding means in turn from a first cell loading position to a second cell pasting position and then to a cell unloading position, (3) selectively operable solder paste dispensing means located at said second cell pasting position, and (4) means for selectively operating said drive means and said paste dispensing means so as to (a) move a cell on said conveyor from said loading position to said cell pasting position, (b) cause said dispensing means to dispense solder paste onto a cell in said pasting position, and (c) move the cell with the dispensed solder paste from said cell pasting position to said cell unloading position.

In a preferred embodiment of the invention, the conveyor is a turntable having two diametrically opposed cell-holding means, the conveyor drive means is adapted to index the turntable 180° each time it is activated, and the machine comprises a first station where cells are loaded onto and unloaded from the turntable (i.e., a cell loading/unloading position) and a second station where solder paste is applied to a cell on the turntable (i.e., the cell pasting position).

The solder paste dispensing means comprises at least one dispensing nozzle and preferably, but not necessarily, means for moving each nozzle between a first non-dispensing position characterized by a relatively large gap between the nozzle and a cell disposed at said cell pasting station, and a second dispensing position characterized by a relatively small gap between each nozzle and a cell disposed at said cell pasting station, whereby to permit cells to be moved into and out of the pasting station without interference by said dispensing means. Also as hereinafter described, the machine preferably, but not necessarily, comprises two paste dispensing assemblies, one located at a level above and the other located at a level below a cell in the cell pasting position, whereby solder paste may be dispensed simultaneously onto the front and back sides of the cell disposed in said cell pasting position. An additional optional feature of the invention is use of means for limiting the force with which each nozzle contacts a cell in cell-pasting position.

Other features and advantages of the invention are described in or rendered obvious by the following detailed description of the invention which is to be considered together with the accompanying drawings.

THE DRAWINGS

Throughout the drawings, like reference numerals are utilized to identify like elements. It also should be understood that the drawings are intended to be illustrative only. Consequently, certain of the components are shown schematically because they are conventional and/or can be fabricated by ordinary persons skilled in the art without need for resorting to invention or extensive experimentation. Also, for convenience and ease and clarity of illustration and description, certain components of the apparatus are neither shown to scale nor shown exactly in accordance with their relative proportions.

DETAILED DESCRIPTION OF PREFERRED EMBODIMENTS

Figure 1:
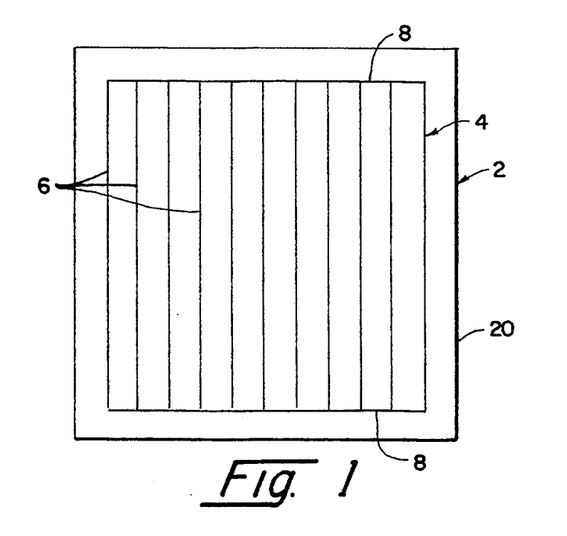
FIG. 1 is a plan view of the front side of a solar cell.
Figure 2:
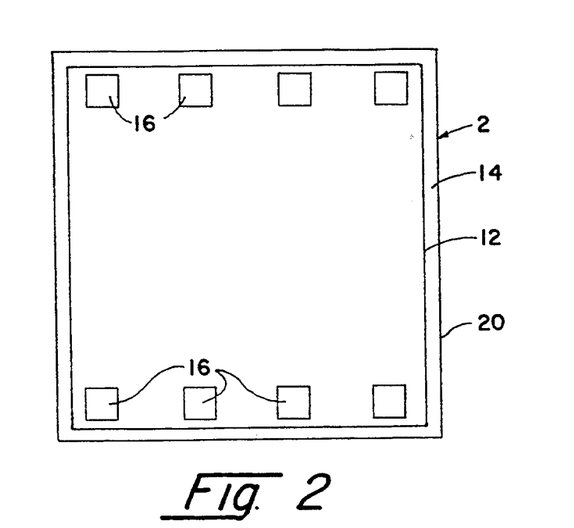
FIG. 2 is a plan view of the rear side of the same solar cell.
Figure 3:
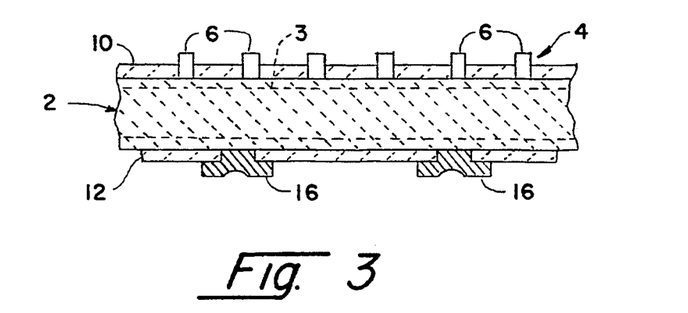
FIG. 3 is a fragmentary sectional view in side elevation of the same solar cell.

The primary purpose of the preferred embodiment of the invention is to provide apparatus for efficiently and reliably applying solder paste to predetermined areas of solar cells of the type exemplified in FIGS. 1–3. The cell 2 shown in these figures comprises a silicon EFG-grown substrate in the form of a sheet or wafer that has been processed so as to have a shallow P-N junction 3 (FIG. 3) adjacent its front surface. The cell also has on its front side a silver front contact 4 preferably in the form of a grid consisting of an array of narrow, elongate, parallel fingers 6 and at least one but preferably two bus bars 8 that interconnect fingers 6. Additionally, a thin silicon nitride AR coating 10 (FIG. 3) covers those portions of the front surface of the substrate that are not occupied by grid electrode 4. The rear side of cell 2 comprises a rear contact 12 (FIG. 2) that is made of aluminum metal and terminates short of the outer edges of the rectangular cell so as to have an uncoated margin portion 14 (FIG. 2) that extends along each side of the cell substrate coextensive with the periphery of the substrate, and also two rows of silver metal soldering pads 16 that fill apertures formed in the rear contact and are fused to the underlying solar cell substrate. Pads 16 overlap the rear contact around the periphery of the apertures in contact 12. Although FIG. 2 shows eight soldering pads, it is to be understood that the number and spacing of the soldering pads may be varied and is not critical to this invention. Solar cells of the foregoing type are well known and, for example, are disclosed by PCT International Publication No. WO 92/02952, supra.

Although EFG-grown silicon substrates are generally flat, the surfaces of such substrates are uneven. As noted in U.S. Pat. No. No. 5,151,386, issued 29 Sep. 1992 to Frank Bottari et al for "Method Of Applying Metallized Contacts To A Solar Cell, the surfaces of EFG-grown substrates have undulations and random peaks and depressions with a flatness deviation in the range of 0.004 to 0.010 inch, and the cells may curl or warp with a flatness deviation up to 0.100 inch. This flatness deviation is a factor that was considered in developing the method and apparatus hereinafter described.

Figure 4:
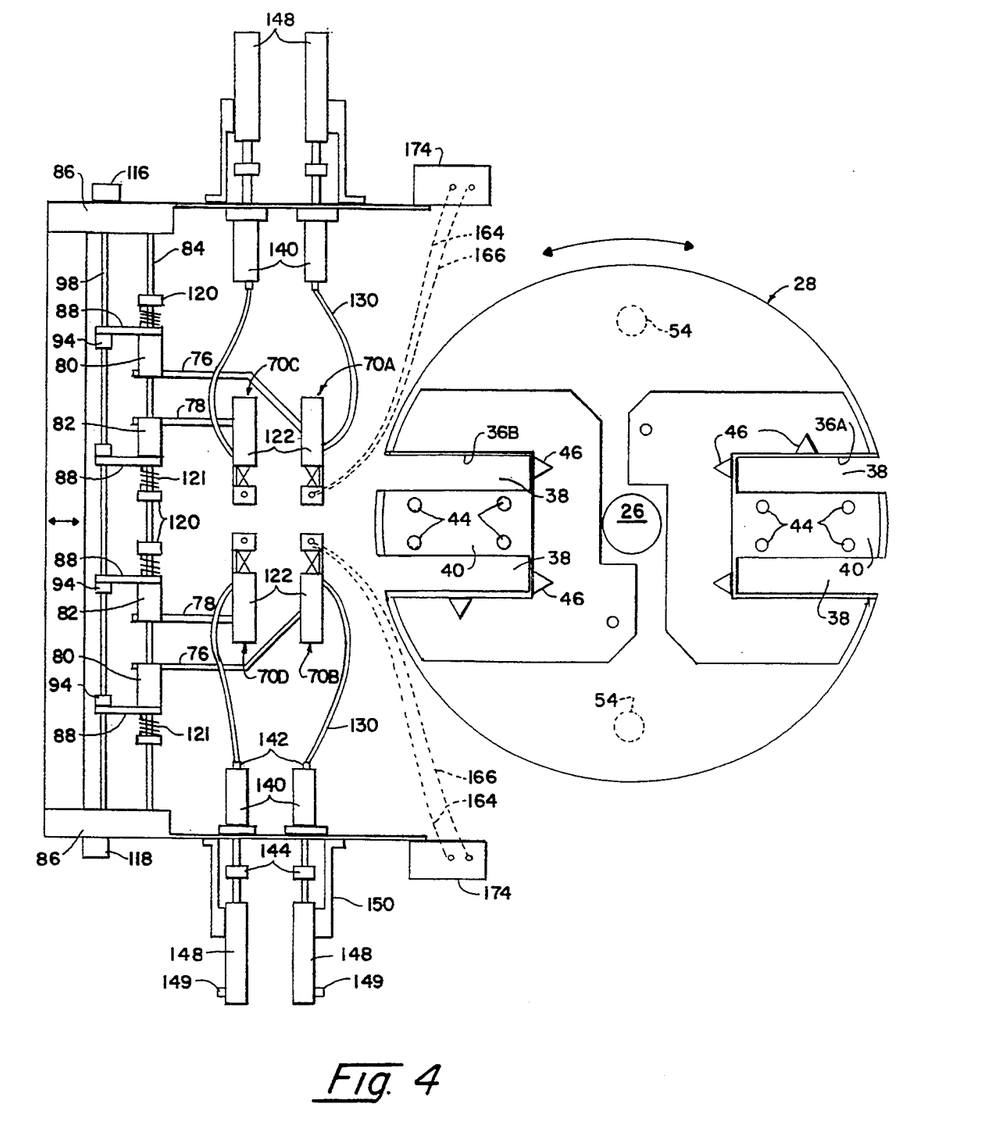
FIG. 4 is a schematic plan view of a solder paste dispensing machine constituting a preferred embodiment of the invention.
Figure 5:
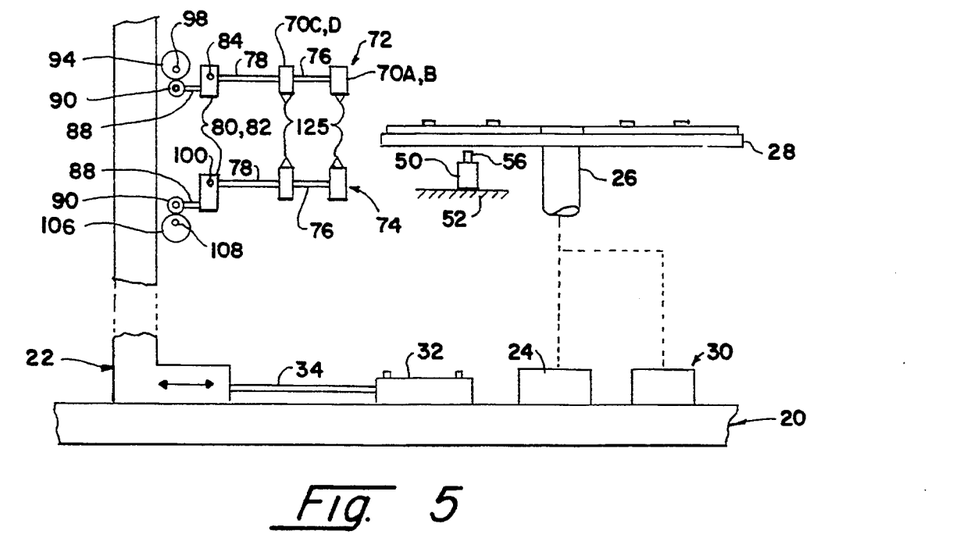
FIG. 5 is a schematic side view in elevation of the same machine.

Referring now to FIGS. 4 and 5, the invention provides a machine that, in its preferred embodiment, comprises a base 20 which acts as a support for a carriage represented schematically at 22 that is mounted for reciprocal motion along a straight line axis parallel to the plane of base 20. Additionally, base 20 acts as a support for a journal 24 that rotatably supports a vertically extending shaft 26 on which is secured a turntable 28. The latter may be made of an opaque or transparent material.

Shaft 26 is coupled to a turntable drive 30. The latter may take various forms. Thus, for example, it may be a reversible electrical stepping motor, mounted coaxial with shaft 26. In the preferred embodiment, the drive means 30 is a linear-to-rotary motion type pneumatic actuator (not shown) which is mechanically coupled to shaft 26, whereby the shaft 26 is rotated in a first direction when the pneumatic actuator is operated by application of pressurized air to one end of its cylinder, and in a reverse direction when the pneumatic actuator is operated by application of pressurized air to the opposite end of the same cylinder. By way of example, actuator 30 may be of the type shown in FIG. 9 of U.S. Pat. No. No. 3,997,123 wherein the reciprocating piston assembly of the actuator comprises a gear rack that drives an output pinion gear coupled to an output shaft, in this case, turntable shaft 26. The actuator is adapted so that when its piston assembly undergoes its "forward"0 stroke, shaft 26 is driven 180° in a first direction, and when the piston assembly undergoes its reverse stroke, shaft 26 is rotated 180° in a second opposite direction. If the drive means 30 is a reversible electric motor, then the control system for the machine (hereinafter described) is required to be adapted to cause the electric motor to rotate shaft 26 first 180° in one direction from an initial "start" or "zero" position to a second position in response to a first command signal, and then 180° back again to the original "start" position in response to a second command signal.

In this preferred embodiment, a mechanical turntable lock is provided in the form of a pneumatic actuator 50 (FIG. 5) which is attached to a suitable support 52 that is fixed with respect to base 20. Turntable 28 is provided with two diametrically-opposed cavities (i.e., blind holes) 54 (FIG. 4) in its bottom surface that are sized to receive and make a close fit with the end of the operating shaft 56 of actuator 50. Actuator 50 is positioned so that the operating stroke of its shaft 56 will cause the latter to move in and out of a cavity 54, thereby locking or unlocking the turntable for movement by drive means 24.

Carriage 22 is coupled to a carriage drive means represented schematically at 32 (FIG. 5) which is adapted to move the carriage on command from one to the other of three distinct positions along a straight line path that extends along a radius of turntable 28. Drive means 32 may take various forms. Preferably it comprises an electrical stepping motor (not shown) which is connected to carriage 22 by a suitable mechanical motion-transmitting means 34, e.g., a rack and pinion connection (not shown). Drive means 32 is connected to the control system hereinafter described which operates the drive means so that carriage 22 will be positioned at and moved from one to another of a first retracted position, a second extended position, and a third intermediate position, in a predetermined sequence, as hereinafter described.

Referring now to FIG. 4, turntable 28 is provided with two recessed solar cell nests 36A, 36B that are diametrically opposed to one another. With respect to each nest, the turntable 28 is provided with a pair of slots 38 that extend along portions of two parallel chords of the circle formed by the periphery of the turntable, whereby each nest 36 is provided with peninsula-like fingers 40 which acts as a support for a solar cell 2. Slots 38 expose selected areas on the top and bottom sides of a solar cell to the paste dispensing means hereinafter described. Each of the peninsula-like fingers 40 is provided with a plurality of apertures 44 that act as suction holes whereby suction may be applied to a solar cell 2 disposed in the nest so as to hold it tight against the turntable. The turntable also is provided with a plurality of upstanding projections 46 on its upper surface that are disposed adjacent to the nests 36A, 36B and act as stop guides to facilitate accurate positioning of cells 2 in the nests. As shown in FIG. 4, three projections 46 are associated with each nest so as to define a right angle configuration.

Figure 10:
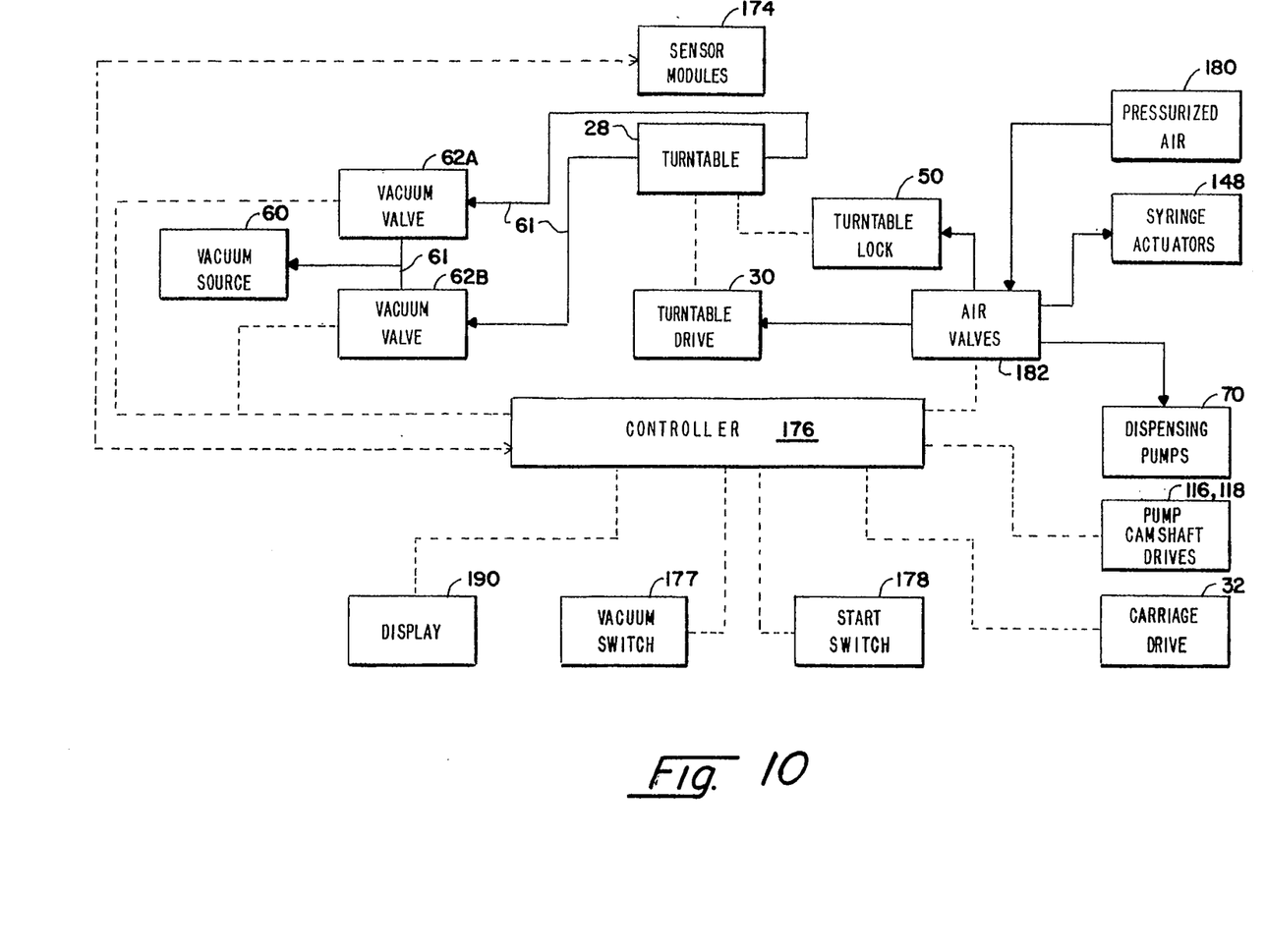
FIG. 10 is a schematic diagram of the electrical control system of the machine.

Nests 36A, 36B are centered on a diameter of the turntable, and the invention contemplates that cells 2 will be positioned in the nests as permitted by stop guides 46, so that their busses 8 and the two rows of silver soldering pads 16 are aligned with slots 38. Although not shown, except for the schematic representation in FIG. 10, it is to be understood that flexible hose means are provided for coupling each suction hole 44 to a vacuum source 60 (FIG. 10). More specifically, suction holes 44 associated with nest 36A are coupled by hoses (not shown) to a first solenoid operated vacuum control valve 62A, while suction holes 44 of the other nest 36B are coupled by additional hose lines (not shown) to a second solenoid operated vacuum control valve 62B. Electrical operation of valves 62A, 62B will cause the valves to apply suction to, or remove suction from, the associated suction holes 44. Operation of valves 62A, 62B is controlled by a controller 176 (FIG. 10) as hereinafter described.

The machine also comprises means for dispensing solder paste onto cells 2 that are carried by nests 36A, 36B. The paste dispensing mechanism comprises a plurality of dispensing/sensing assemblies 70 (FIGS. 4–7) that are arranged in upper and lower arrays 72 and 74 (FIG. 5) so that solder paste may be applied simultaneously to the bus bars 8 and the solder tabs 16 of a solar cell 2 carried by turntable 28. The dispensing/sensing assemblies are arranged to be accurately located with respect to the "X" and "Y" (horizontal) axes of the solar cell, but capable of moving in the "Z" (vertical) direction. This arrangement allows the machine to accommodate for cells that do not have perfectly flat surfaces, e.g., cells made from EFG-grown silicon substrates.

As seen in FIG. 4, the upper array 72 comprises four dispensing pump assemblies arranged as a front pair 70A, 70B and a rear pair 70C, 70D. The front pair are carried by support arms 76 and the rear pair are carried by support arms 78. The bottom array 74 is substantially identical to the upper array, with its front pair being carried by support arms 76 substantially identical to arms 72 and its rear pair being carried by support arms 78 substantially identical to arms 74.

It is to be understood that cells 2 will be disposed in nests 36A, 36B so that their silver soldering tabs 16 face upwardly and their silver busses 8 face downwardly, although the apparatus will operate equally well if the cells fare reversed so that soldering tabs 16 face downwardly. Also, cells 2 are placed in nests 36A, 36B so that the silver soldering pads 16 extend horizontally as viewed in FIG. 4).

Accordingly, the upper array 72 is disposed so that its dispensing pump assemblies 70A, 70C are aligned with one row of pasting tabs 16 of a cell 2 mounted on the turntable in nest 36B and the other two of its dispensing pump assemblies 70B, 70D are aligned with the other row of tabs 16 of the same cell. Similarly, the lower array is disposed so that two of its dispensing assemblies 70 corresponding to assemblies 70A, 70C are aligned with one of the buses 8 of the same cell, and the other two of its dispensing pump assemblies corresponding to assemblies 70B, 70D are aligned with the other bus 8 of the same cell.

Figure 9:
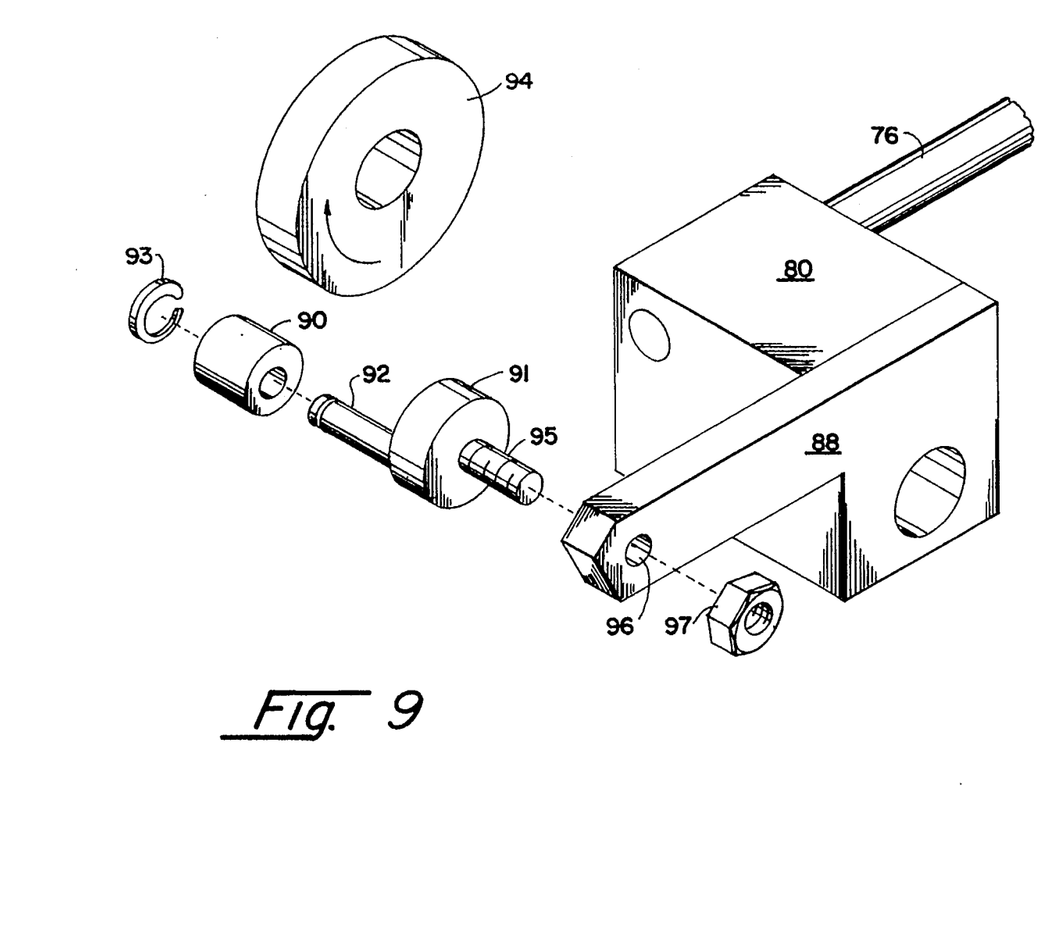
FIG. 9 is a perspective view of the rear portion of a rocker arm showing how the position of a cam follower roller can be adjusted.

The rear ends of support arms 76 and 78 are secured to mounts 80 and 82 (FIG. 4) respectively that are rotatably mounted on a rocker shaft 84 which is secured against rotation in two side frame members 86 that are affixed to and constitute part of carriage 22. Mounts 80 and 82 are identical except that they are mirror images of one another. Each mount 80, 82 includes a rearwardly-extending rocker arm 88. Mounted on the rear ends of rocker arms 88 are circular cam follower rollers 90 (FIGS. 5 and 9). These cam follower rollers ride on and are engaged by individual eccentric cams 94 that are mounted on a cam shaft 98. The ends of cam shaft 98 are rotatably mounted to side frame members 86. Preferably each cam follower roller is mounted to its associated rocker arm 88 by an eccentric swivel arrangement that permits the cam follower roller to be pivoted about an axis that is parallel and eccentric to its own axis. This swivel arrangement permits more accurate positioning of each pump assembly so that all of them can be at the same height relative to the solar cell substrate that is to receive solder paste.

The rear ends of the support arms 76 and 78 of the bottom array of dispensing pump assemblies are secured to like mounts 80 and 82 that are rotatably mounted on a second rocker shaft 100 which also has its ends secured to side frame members 86. The cam follower rollers 90 on the rear ends of rocker arms 88 associated with the lower array 74 of dispensing pump assemblies ride on eccentric cams 106 that are mounted on a second cam shaft 108 that is rotatably mounted to side frame members 86.

Figure 8:
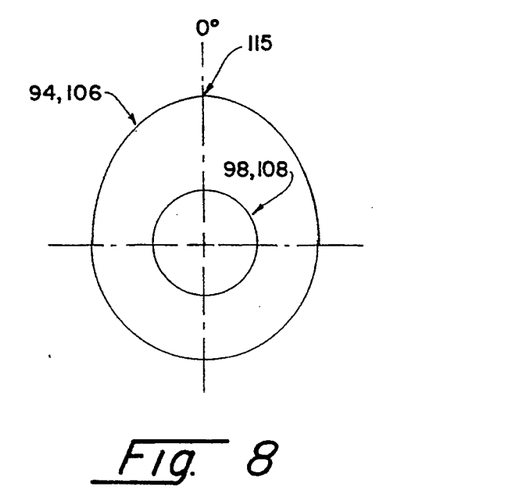
FIG. 8 is a side view in elevation of one of the cams employed in the machine.

FIG. 8 illustrates the profile of one of the cams 94 and 106. As shown, each cam has a high spot 115 which is in the 12 o'clock position as shown at the end of a cycle of operation. The broken lines indicate the 0°–180° and 90°–270° positions.

Cam shafts 98 and 108 are driven by electric motor drives represented schematically at 116 and 118 respectively (FIG. 4) that are mounted to the carriage. Preferably drives 116 and 118 comprise d.c. motors. When cam shafts 98 and 108 are rotated by drives 116 and 118, cams 94 and 106 are rotated to cause rocking of the associated support arms 76, 78 in synchronism with cam shaft rotation.

Referring now to FIG. 9., each cam follower roller 90 is rotatably mounted on a stub shaft 92 that forms part of an eccentric adaptor 91. Roller 90 is retained on shaft 92 by a retaining ring 93. Shaft 92 is eccentric to the center axis of adaptor 91. The latter has a second stub shaft 95. Shaft 95 is coaxial with the center axis of adaptor 91 and hence is eccentric to stub shaft 92. Stub shaft 95 is disposed in a hole 96 in the rear end of a rocker arm 88. The outer end of shaft 95 is threaded to receive a nut 97 that locks it to the rocker arm. By releasing nut 97, it is possible to rotate adaptor 91 in hole 96 (i.e. rotate it on the axis of stub shaft 95) so as to move stub shaft 92 and thereby the axis of cam follower roller 90 in an orbital path around the axis of stub shaft 95. This adjustment feature permits precise timing of the movement of rocker arm 88 under the influence of a cam 94 (or 106 in the case of the lower array).

Also mounted on upper rocker shaft 84 are four spring anchors 120 (FIG. 4) and four coiled torsion springs 121. Anchors 120 are releasably locked to shaft 84. One end of each spring 121 is secured to an anchor 120 and its other end is secured to one of the rocker arms 88. Although not shown, it is to be understood that identical spring anchors and springs are mounted on the second (lower) rocker shaft 100, with each bottom spring having one end tied to a bottom spring anchor and its other end locked to a bottom rocker arm. Springs 121 serve to apply turning forces to the rocker arms as hereinafter described. The amount of turning force exerted by springs 121 can be modified by turning anchors 120 relative to shaft 84.

Cams 94 are sized and mounted so that their "high" spots 115 (the 0 degree position shown in FIG. 8) force rocker arms 88 to keep the dispensing pumps in the upper array in raised position relative to the turntable, preferably about 1 inch above the level of any cells on the turntable, when the machine is at rest. When cams 94 are rotated so as to move their high spots 115 off of rollers 90, the weight of the upper dispensing pumps causes them to drop towards the level of the turntable at a controlled speed determined by the rate at which the cams are rotated by their drive motor 116. Springs 121 on shaft 84 are arranged to exert a counterbalancing force on upper arms 76, 78, thereby limiting the contact force exerted by the pump nozzles on a cell in nest 36B. Preferably anchors 120 on shaft 84 are set so that springs 121 limit the force with which the nozzles 125 contact the cell in nest 36B to a contact force of about 30 grams or less.

Preferably but not necessarily, the shapes of cams 90 and 108 that control pivotal movement of arms 76 differ slightly from the shapes of the other cams 90 and 108 that control pivotal movement of arms 78, due to the difference in length of those arms, since the longer arms need move through a smaller angle to effect movement of their associated pump assemblies through the same linear distance as the pump assemblies carried by the shorter arms.

The lower cams 106 also are arranged so that their high spots 115 keep the nozzles in the lower array spaced from the turntable a suitable distance, e.g., approximately 1 inch, when the machine is at rest. When cams 106 are rotated during the cycle of operation, the torsion springs 121 on the lower rocker shaft 100 exert a turning force (a counterclockwise force as viewed in FIG. 5) on the lower support arms 76, 78 sufficient to offset the force of gravity on the lower pumps and cause those arms to move the lower pumps upward into contact with the cell in nest 36B, with the contact force exerted by each dispensing nozzle on the cell in nest 36B not exceeding about 30 grams.

It is to be observed that the upper and lower dispensing pump assemblies are arranged so that the nozzles of the upper pump assemblies contact the upper side of the solar cell in nest 36B at points that are directly in line with the points at which the nozzles of the lower pump assemblies contact the lower side of the same substrate.

Thus the contact force exerted by each upper pump assembly on the cell is balanced by the equal and opposite force exerted by a corresponding lower pump assembly, resulting in minimal net stress applied to the cell.

Figure 6:
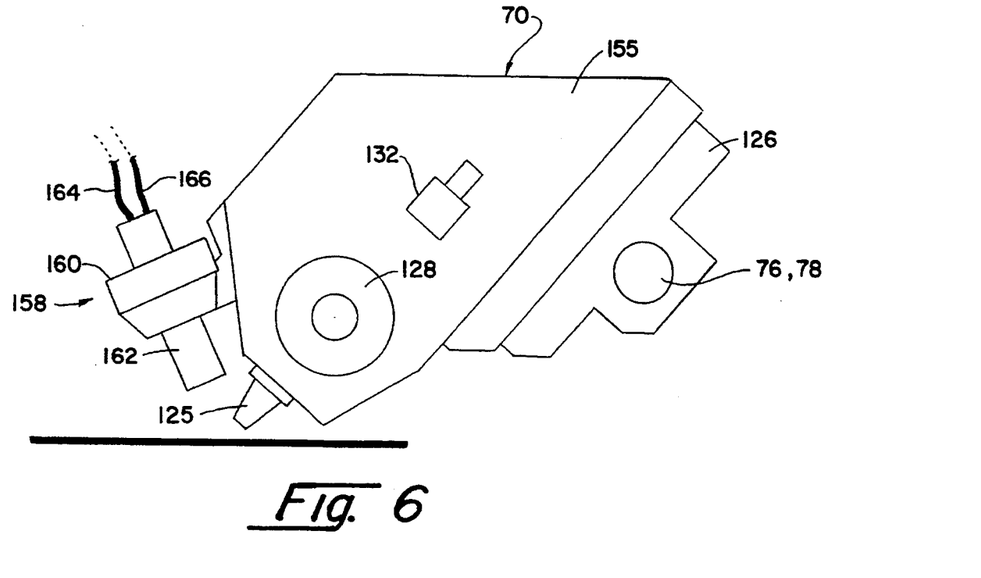
FIG. 6 is a side view in elevation on an enlarged scale of one of the solder paste dispensing heads.
Figure 7:
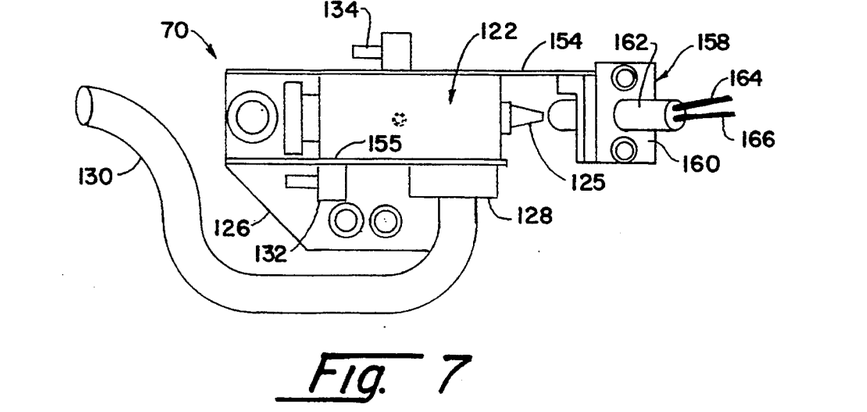
FIG. 7 is a plan view of the solder paste dispensing head shown in FIG. 6.

Referring now to FIGS. 4, 6 and 7, each dispensing pump assembly 70 (A-D) comprises a positive displacement dispensing pump 122 which is capable of dispensing solder paste in relatively small but predetermined amounts, sometimes referred to as "shots". Various kinds of positive displacement dispensing pumps may be used in practicing the invention. In the preferred embodiment the invention utilizes a positive displacement pump of the kind that has an internal chamber for accommodating a supply of material to be dispensed, a first feed port through which material to be dispensed is delivered to the internal chamber under pressure, a second dispensing port through which the same material is discharged, and a displacement member which is movable by a selectively applied force between a first position in which material to be dispensed is introduced to the chamber under pressure and a second position in which the displacement member displaces material from the chamber and discharges it via the second dispensing port.

Preferably pump 122 is a pneumatically operated Model MP 103 Plunger Pump manufactured by Iwashita Engineering, Inc. of 1010 Stewart Drive, Sunnyvale, Calif. 94086. As such, each pump has an axial bore (not shown) which is shaped to define an internal charging chamber for receiving solder paste to be dispensed, a positive displacement pump member (also not shown) mounted in the axial bore for reciprocal movement, the pump member comprising a piston-headed plunger (also not shown) for displacing a predetermined "shot" of paste from the charging chamber, a first side feed port through which solder paste is fed to the internal charging chamber, and an end dispensing port through which solder paste is dispensed. Further details of the internal construction of the pump are well known to persons skilled in the art and are not specifically described or illustrated herein for that reason and also because they are not critical to the patentability of the invention.

As seen in FIGS. 6 and 7, the end dispensing port (not shown) of each pump 122 has a dispensing nozzle 125 for dispensing solder paste discharged from the pump's internal charging chamber (not shown). Each pump is fixed to a support 126 (FIGS. 6 and 7) which in turn is mounted to the end of one of the support arms 76 and 78. Each pump comprises a side inlet port provided with a fitting 128 for connection to a hose line 130 that supplies solder paste to the pump's charging chamber. Additionally, each pump has two side ports provided with hose fittings 132 and 134 for connecting the ports to a pneumatic control system (see FIG. 9). The control system is adapted to apply pressurized air in an alternating mode to the pump via fittings 132 and 134 to operate the pump. When the air pressure applied to fitting 134 is increased and simultaneously the air pressure at fitting 132 is decreased (e.g., by venting to the atmosphere), the pump's piston-headed plunger (not shown) is retracted pneumatically so as to permit solder paste to flow into the internal charging chamber; if then the air pressure applied to fitting 132 is increased (and simultaneously the air pressure applied to fitting 134 is decreased by venting to the atmosphere), the plunger will be forced pneumatically to an extended position whereby it will expel solder paste from the charging chamber via tapered nozzle 125. The control system of the machine is arranged so that at the end of each cycle of operation, the pump plungers are in extended position so as to prevent flow of solder paste.

Referring now to FIGS. 4 and 7, the side feed port fitting 128 of each pump is connected by a hose line 130 to a paste-supplying syringe 140. Each pump is supplied by a separate syringe. Each syringe comprises a hollow body having an internal axially extending bore (not shown) that terminates at one end in a discharge port 142 that is connected to hose line 130. The internal bore in the syringe is filled with solder paste and is fitted with a plunger (not shown) that is movable axially within the bore so as to apply pressure to expel solder paste via discharge port 142. In the preferred embodiment of the invention, a separate syringe is provided for each pump, and the plunger (not shown) of each syringe is releasably coupled, e.g., by a mechanical coupling 144, to the piston rod of a pneumatic actuator 148 which may (but need not) be a single-acting unit in the sense that it has one air inlet port 149 for admitting air to drive its operating shaft in one direction and an internal spring for moving its operating shaft in a second opposite direction. Although one actuator 148 may be coupled to operate two or more syringes, it is preferred that there be one actuator for each syringe, as shown in FIG. 4. Each actuator is secured to a side member 86 of carriage 22, e.g., by brackets 150. Actuators 148 have their air inlet ports 149 connected to a source of pressurized air 180 (FIG. 10), whereby the paste in each syringe is under substantially the same constant hydraulic pressure. With this arrangement, each time that the piston-headed plunger of a pump 70 is retracted, positive pressure will cause solder paste to advance forwardly from the associated syringe via the pump side port so as to fill that portion of the axial bore in the pump body that is in advance of the pump plunger, i.e., the internal charging chamber. Once that has occurred, little further movement of paste in the line connecting the syringe body to the pump will occur until after the pump has undergone one complete cycle of operation, i.e., until after its piston-headed plunger has moved forward to dispense paste and then moved backward again to its retracted position. It should be noted that although some movement of paste can occur while the pump plunger is retracted, any such movement is fairly slow and limited by the short cycle times for operation of the pump plunger. Accordingly, dispensing volume accuracy and repeatability of the "shot") of dispensed solder is maintained.

Referring now to FIGS. 6 and 7, attached to each pump support 126 by mounting members 154, 155 is a sensor assembly 158 which comprises a housing 160 in which is disposed a guide tube 162. The latter projects from the bottom end of the housing and serves as a support for distal end portions of two flexible optical fibers (i.e., light pipes) 164 and 166 that have the ability to transmit light. The outer surfaces of the light fibers are treated so as to reduce loss of light from the fibers. The distal end of each guide tube 162, or the distal end surfaces of light fibers 164 and 166, may be provided with lenses (not shown) for focusing purposes, but such lenses are not absolutely required. The distal end portions of the fibers are anchored in guide tubes 162 by suitable means, e.g., by potting with an epoxy cement. Guide tubes 162 are disposed so that their longitudinal axes intersect the center axis of nozzles 125 at the cell disposed in nest 36B, and arms 76, 78 are arranged so that when the pump assemblies are moved toward the turntable their nozzles 125 will engage the silver soldering tabs 16 or the silver bus bars 8 of a cell in nest 36B.

The proximal ends of each pair of light fibers 164 and 166 are coupled to a separate sensor module 174 that is mounted to carriage 22 (FIG. 4). Preferably a separate module 174 is provided for each dispensing pump assembly. Each module comprises a light source (not shown) that transmits a continuous beam of light of a selected wavelength along light fiber 164 so as to illuminate an identical portion of a cell 2 disposed below the associated dispensing nozzle, and also a light sensor (not shown) capable of producing an electrical signal output in response to a change in the amount of light reflected back via fiber 166. In addition, each module includes other circuit elements (not shown), including an amplifier and signal processing means, whereby the sensor module interacts with the control system to permit control of operation of the machine as hereinafter described.

The light fibers are positioned so that a light fiber 164 will direct a light beam toward a cell disposed in a nest occupying the position of nest 36B in FIG. 4, and that light will be reflected back to a light fiber 166 by a soldering pad 16 or a bus bar 8 of that cell, since pads 16 and bus bars 8 have relatively shiny surfaces that reflect light. However, when a daub of solder paste is applied, the amount of light reflected back to light fiber 166 by that daub is less than what is normally reflected by a soldering pad or a bus bar, and in that case the sensing module will produce a signal indicative of the fact that solder paste has been applied properly to the cell. On the other hand, if a pump fails to apply solder paste as intended, the amount of light reflected back from the cell will not have diminished and hence the associated sensing module will produce a signal that is indicative of the fact that solder paste has not been applied to the cell.

FIG. 10 is a schematic representation of the operating control system of the machine. In this figure, air lines are shown in full lines and electrical and mechanical connections are represented by dotted lines. Vacuum is applied from a vacuum source 60, e.g., a vacuum pump, to the holes 44 of nests 36A and 36B via conduits 61 and separate electrically operated control valves 62A and 62B which are electrically controlled by a controller 176. The control system also includes a source of pressurized air 180, which may take the form of a compressor and a pressure regulator (not shown), for applying air pressure to dispensing pumps 70, syringe actuators 148, turntable drive 30, and turntable lock 50 via suitable solenoid-operated air valves represented collectively at 182.

Controller 168 may be a commercially available programmable controller, but preferably it comprises a digital computer that is programmed so as to cause the various operating units of the machine to be operated in a predetermined sequence called the "cycle of operation". The control system includes a manually operable "start" switch 178, Optionally and preferably, it also includes a manually operable "vacuum" switch 177. Controller 176 is programmed so that when the system is first energized, no suction is being applied via valves 62A and 62B to nests 36A and 36B respectively, the turntable is locked in place by lock actuator 50, and the dispensing pump assemblies 70 are positioned so that their nozzles 125 are raised (or lowered, as the case may be) away from the turntable.

The controller also is programmed so that during a single cycle of operation carriage drive 32 will position carriage 22 in each of three different positions, namely: (1) a first retracted ("service") position (FIG. 5) wherein the dispensing pump nozzles are positioned out of line with a cell located in the position of cell nest 36B shown in FIG. 4, in which position the pumps may be serviced, e.g, by replenishing the supply of solder paste; (2) a second extended position wherein the upper nozzles are located over the first and second soldering tabs 16 (reading from right to left in FIG. 2, and (3) a third intermediate position wherein the upper nozzles are aligned with the third and fourth soldering tabs (again reading from right to left in FIG. 2).

As a further measure, controller 176 is programmed so that in the event a sensor module 174 detects that solder paste has not been properly dispensed by a pump, the controller will activate the appropriate air valve 182 to cause that particular pump to be operated again. Preferably the controller is programmed to repeat operation of the same pump up to 3–5 times, if required, to assure proper paste dispensing. If the pump still fails to deposit paste after being operated repetitively as described, the controller (a) issues a signal that causes a display unit 190 to generate a display identifying the malfunctioning pump and (b) also stops the machine to permit whatever repairs or replacements are required to correct the malfunction.

Operation of the machine illustrated in the drawings will now be described, commencing with its at-rest position (see FIG. 4 where nest 36B is in the "cell loading/unloading position", also known as the "cell loading/unloading station", and nest 36B is in the "cell pasting position", also known as the "cell pasting station"). Assume that at this point in time with the machine being at rest, the following conditions exist: (1) no cell is disposed in the nests 36A and 36B (FIG. 4); (2) no vacuum is being applied to the nests 36A or 36B; (3) carriage 22 is in its rearmost (retracted) position, i.e., the position shown in FIGS. 4 and 5; (4) dispensing pump assemblies 70 of the upper and lower arrays 72 and 74 are in their raised and lowered positions respectively, i.e., the position of FIG. 5; (5) actuators 148 exert a constant predetermined force on the plungers of syringes 140, whereby hose lines 130 that connect the syringes to pump assemblies 70 are filled with solder paste under a constant hydraulic pressure; and (6) the piston-headed plungers of pumps 70 are in their extended positions whereby flow of paste is blocked.

Operation of the machine requires the operator to place a cell to be pasted in nest 36A so that its two rows of soldering pads 16 extend horizontally (as viewed in FIG. 4) at right angle to the cam shaft 84. After a cell has been manually placed in nest 36A in engagement with stops 46, the operator first engages switch 177 to effect coupling of vacuum to the apertures 44 of nest 36A, with the result that the cell placed in nest 36A is pulled down and held against the turntable by suction. The operator then actuates start switch 178. When this switch is actuated, controller 176 causes the following to occur automatically in sequence:

(a) the operating shaft of turntable lock actuator 50 is retracted by application of pressurized air, thereby unlocking the turntable for rotation by drive means 30;

(b) then drive means 30 is actuated to rotate the turntable 180°, whereby the nest 36A is rotated to the cell solder/pasting position wherein it now assumes the position occupied by the nest 36B in FIG. 4 (at the same time the nest 36B is rotated to the cell loading/unloading position (i.e., the position of nest 36A in FIG. 4);

(c) then lock actuator 50 is operated so as to cause turntable lock pin 56 to re-engage itself with a second cavity 54 in the underside of the turntable, thereby locking the turntable in its new position which is 180° from its original position;

(d) controller 176 then causes carriage drive 32 to move carriage 22 forwardly toward the operator so as to position arrays 72 and 74 in an extended position in overlapping relation with the cell in the nest 36B located in the cell pasting station, with the nozzles in the arrays 72 and 74 being aligned with the two silver soldering pads 16 in each row of pads that are furthest from the at-rest position of carriage 22;

(e) then the electric motors 116 and 118 are energized to rotate the cam shafts 98 and 108 and thereby cause rocker arms 88 to pivot support arms 76, 78 in a direction to cause the arrays 72 and 74 to move downward and upward respectively relative to the turntable so as to cause nozzles 125 to contact the upper and lower sides of the solar cell in nest 36B; it should be noted that for each dispensing cycle motors 116 and 118 operate for one complete revolution of the cam shafts, but stop briefly (e.g., about 1 second) when the nozzles 125 have engaged the cell to allow for dispensing of solder paste; and then operating again just long enough to complete a full revolution of the cam shaft so as to restore the pump assemblies to their original at rest positions; therefore, in this step (e) motors 116 and 118 operate just long enough to cause the cam shafts to undergo one-half of a complete revolution and thereby place the dispensing nozzles in contact with the cell in nest 36B;

(f) while nozzles 125 are in contact with a cell located by turntable movement in the position corresponding to that of nest 36B in FIG. 4, controller 176 causes pneumatic actuation of pump assemblies 70 of the upper and lower arrays 72, 74, whereby the piston-headed plunger of each pump undergoes a rearward paste-charging stroke and then a forward paste-dispensing stroke, whereby a "shot" of paste is dispensed by the nozzles 125 of the pump assemblies onto the silver soldering tabs that confront nozzles 125 and also onto corresponding areas of the bus bars 8;

(g) then, about one second after they were stopped, motors 116 and 118 are again operated long enough to cause the cam shafts to complete their interrupted cycles of revolution, whereby cams 94 and 106 cause the upper and lower support arms 76, 78 to move the pump assemblies back to their original vertical positions relative to the turntable;

(h) thereafter, in keeping with the objective of providing a strong solder bond between the solar cell contacts and the attaching copper ribbons, controller 176 again energizes carriage drive 32 so as to cause carriage 22 to move rearwardly away from the turntable axis (leftward, as viewed in FIG. 4) to an intermediate position that is just far enough removed from the preceding extended position to align the dispensing nozzles 125 of the dispensing pumps of the upper array with the remaining silver soldering tabs of the cell in the cell pasting station and the dispensing nozzles 125 of the dispensing pumps of the lower array with corresponding portions of the bus bars 8 (as viewed in FIG. 4);

(i) then the controller causes steps (e) and (f) to be repeated to again bring nozzles 125 into contact with the solar cell in nest 36B and cause the dispensing pumps of the upper and lower arrays 72, 74 to dispense daubs of solder paste onto the remaining soldering pads and the corresponding portions of the cell's bus bars;

(j) then the controller causes step (g) to be repeated so as to cause the upper and lower support arms to move pump arrays 72 and 74 back to their original vertical positions away from the turntable, as in step (g); and (k) the controller causes driver 32 to move carriage 22 back to its original retracted position (FIGS. 4 and 5).

As the pasting operation is carried out on the cell disposed in a position corresponding to that of nest 36B in FIG. 4, the operator loads a new cell into the nest occupying the position of nest 36A in FIG. 4. Once this is done, the operator again activates vacuum switch 177 and start switch 178 in turn, whereupon the machine repeats steps (a)–(h) above for another cycle of operation.

In addition to steps (a)–(h), controller 176 automatically causes the appropriate valve 62A or 62B to terminate suction on the solder pasted cell that is moved back to the position occupied by nest 36A in FIG. 4, thereby freeing that cell so it can be removed and replaced by a new cell.

It is to be noted that the controller is programmed so that the procedure of steps (a) to (k) above is modified automatically in the event that the output signal of any optical sensing module 174 indicates that solder paste has not been dispensed by the pump monitored by that module when that pump is operated. In such event, the program of controller 176 will cause the controller to (1) momentarily delay step (g) or (j), as the case may be, (2) cause the malfunctioning pump to operate again while its nozzle is still in contact with the cell, and (3) again determine from the output signal of the corresponding sensing module 174 if solder paste has been applied by that particular pump. If solder paste is properly dispensed by the pump, the controller resumes and completes its normal operating sequence starting with step (g) or (j) as the case may be. However, if the output signal of the optical sensing module again indicates that solder paste has not been applied to the cell, the controller will repeat the foregoing sub-sequence (1) to (3) a predetermined number of times or until it has determined that the pump in question has properly dispensed paste, whichever event occurs first. Preferably, but not necessarily, the controller is programmed to that the sub-sequence (1) to (3) is repeated no more than 5 times. If then the signal from the sensing module still indicates that solder paste was not properly dispensed by that pump, controller 176 will indicate via display 190 which pump has malfunctioned and will also render the machine inoperative until the malfunction has been corrected.

The apparatus just described offers a number of advantages. For one thing, it facilitates the application of solder paste to solar cells so that the solder paste is applied precisely in metered amounts to the cell. A second advantage is that the torsion springs prevent the nozzles of the dispensing pumps from exerting undue pressure on the substrates. In this connection it should be noted that anchors 120, since they are releasably secured to rocker shafts 84 and 100, may be rotated relative to the rocker shafts so as to adjust the force that torsion springs 121 exert on rocker arms 88. This in turn limits the strain on the cells caused by the contact pressure of pump nozzles 125. This is important since the silicon cells, which typically have a thickness in the range of 0.008 to 0.018 inch if they are made from polycrystalline EFG-grown substrates, are quite brittle and hence prone to breakage. A further advantage of the invention resides in the fact that solder is applied simultaneously to both sides of the solar cells, thereby increasing productivity. Of course, the invention also offers the advantage that it can be modified so as to apply paste to only one side (the front or rear side) of a solar cell, but that detracts from its production efficiency.

Another advantage results from the fact that the upper and lower dispensing pump assemblies are arranged so that the nozzle of each upper pump assembly will contact a point on the upper side of the cell that is directly above a point on the lower side of the cell that is contacted by the nozzle of a lower pump assembly. As a result the contact force applied to the cell by each upper pump assembly is balanced by the opposing contact force exerted by a correspondingly positioned lower pump assembly, and this in turn results in a reduction or substantial elimination of bending and shear stresses that might otherwise fracture the cell. Consequently the only substantial stress on the cell resulting from the contact forces of the dispensing pump nozzles is a compressive stress through the thickness of the cell, and the cell is capable of surviving the latter type of stress. This aspect of the invention will become more important in the future as the cells become thinner and hence even more fragile.

A virtue of the cam mechanisms that guide the dispensing pump assemblies as they move into contact with the cell surfaces is that they let the pumps "find" the cell surface at whatever height the cell surface may be in the Z plane, and then let the pumps rest there during the dispensing operation. Preferably the cams are shaped so that when as the pumps come to rest on the cell, the cams rotate out of contact with the cam followers, and when the cams start rotating again after paste has been dispensed, the cams re-engage the cam followers and then act through the cam followers to guide or force the pumps away from the cell surface. Another virtue of the cam mechanisms is that the cams are shaped to provide slow pump movement as the pump comes into the zone of proximity with the cell, so as to minimize impact forces, but relatively fast pump movement outside of that zone, thereby permitting rapid machine cycling.

Also of importance is the fact that the machine includes means for determining if solder paste has been properly applied and for indicating when solder paste has not been applied as intended, and for automatically re-operating a dispensing pump assembly if it appears that the pump failed to dispense paste properly when first commanded to do so. This results in a high yield of cells that have been properly provided with daubs of solder paste. Re-operating a pump assembly that has malfunctioned while the cell is still in the cell-pasting station saves time and thus increases productivity.

Another unique feature of the invention is that it provides a machine that is capable of dispensing solder paste in an upward direction, notwithstanding the effect of gravity. This mode of operation is possible because the rheological properties of solder paste are such as to render gravity a negligible factor in controlling the dispensing action. Available solder pastes, such as those having between about 96% tin/4% silver and 98% tin 2% silver, are known to provide the surface tension required to control flow of paste out of the nozzle and provide the required cohesion and adhesion of small daubs of the paste on the cells. Such solder pastes are available commercially, as exemplified by the "96% tin/4% silver Xersin 2005" solder paste manufactured by Multicore Corp. of Westbury, N.Y. that is mentioned in U.S. Pat. No. 5,074,920, issued 24 Dec. 1991 to R. C. Gonsiorawski et al for "Photovoltaic Cells With Improved Thermal Stability". That particular paste is a stable blend of pre-alloyed solder powder and a synthetic flux sold under the trade name "Xersin 2005". Such a solder has the advantage that it can be dispensed at ambient temperature, i.e., 25 degrees C., as contemplated by this invention. It is preferred that the paste have a viscosity of about 300,000 centipoise at that temperature.

A further significant advantage is that the apparatus is relatively simple to construct and hence is reliable in its operation. The invention also is beneficial because it may be adapted for use with means for automatically feeding cells to and removing cells from the turntable.

In specific relation to solar cells of the type having a front contact comprising a plurality of narrow conductive metal fingers joined together by at least one bus, and a rear contact having a plurality of apertures and electrically conductive soldering pads in said apertures in bonded and electrically conductive relation with the back side of the solar cell substrate and the rear contact, the invention is advantageous in that it provides a novel method and apparatus for applying solder paste to selected portions of said at least one bus and the soldering pads. In this connection it should be observed that a further advantage results from having the pivot axis of each group of dispensing pump assemblies extend at a right angle to the bus bars of the cell to be pasted, so that any unavoidable inaccuracy resulting from the pivot motion would be along the length of the bus bar, rather than across it. Since the bus bar is continuous, no harm results if the solder daub is applied to the bus bar at a point along its axis that is somewhat short of or somewhat beyond the intended point of deposit. On the other hand, inaccuracy of solder deposition occurring along a line running transversely of the bus bar is less tolerable, becoming unacceptable if the inaccuracy is great enough for the solder to miss contacting any part of the bus bar.

Further advantages of the invention are that it provides a novel and reliable apparatus and method of applying solder paste to a substrate having a non-flat surface without the need for height sensing of the substrate. Also it provides a machine that is capable of inspecting the dispensing of solder paste while the pump is still in paste-dispensing position relative to the cell. This capability is due at least in part to the fact that the pump assemblies are disposed with their nozzles inclined at an angle of 40 to 50 degrees, preferably 45 degrees, to the cell surface, thereby allowing the optical fibers to be mounted to the pump with their distal light transmitting ends in close proximity to the nozzles, so as to permit inspection of the solder paste as it is dispensed, and also without any movement of the pump being required to permit inspection. The latter allows for immediate re-operation of one or more pump assemblies to assure that solder paste is dispensed as required.

Still another important advantage is that it provides a feasible and proven method and apparatus for applying solder paste to multiple sites on a substrate simultaneously and/or applying solder to both sides of a substrate simultaneously.

A particularly unique advantage is that the invention detects whether or not solder paste has been applied successfully to predetermined areas of a solar cell or other electronic device substrate using a plurality of paste-dispensing devices and to instantaneously reactivate those devices that have failed to apply paste as previously commanded while the cell or other substrate is still in the paste-dispensing station.

Another important advantage of the invention is that it is susceptible of a variety of modifications and may be practiced using conventional as well as state of the art components. Thus, for example, the machine may be modified so as to utilize standard disposable pre-loaded solder paste syringes, or other syringes especially adapted for use in the invention. A further obvious modification is that the turntable may be provided with drive means adapted to cause the turntable to rotate unidirectionally rather than bidirectionally. Using a unidirectional drive for a turntable that has two cell-receiving nests does not appreciably alter the inherent mode of operation of the machine, and such modification preferably is accomplished using an electric motor rather than a pneumatic actuator as the drive means for the turntable.

In the preferred embodiment described above, the cell-loading station and the cell-unloading station are one and the same. However, it is contemplated that the cell-loading station and the cell-unloading station may be at separate and distinct locations.

A further modification obvious to persons skilled in the art is to replace the optical sensing arrangement herein described with a separate optical inspection station located between the cell loading station and the cell pasting station. Additionally, it is contemplated that in the case where the turntable is rotated unidirectionally, it is possible to provide the turntable with more than two cell-receiving nests and to index the turntable in increments less than 180° as required to shift the cell-receiving nests from the cell loading station to the cell pasting station. In such case it is also contemplated that the apparatus may be arranged so that each nest on the turntable is moved in turn from a first cell loading station, then to a cell pasting station, then to a separate cell unloading station, and then back to the cell loading station. This multi-station arrangement consisting of the cell loading station, the cell pasting station, and the cell unloading station, is advantageous in that it facilitates the use of automatic means for placing cells on the turntable and removing cells from the turntable after they have been pasted.

It is to be appreciated also that the optical sensor means may be used in two different ways. One way, as described hereinabove, involves positioning the light fibers so that light is directed at and reflected back by the silver bus bar(s) and the silver soldering pads on the cell, and confirming the proper deposition of solder paste on the cell by utilizing the fact that the presence of solder paste on the bus bar(s) and the soldering pads will reduce the amount of reflected light sensed by the sensor modules 174. The second way is to use the optical sensing means to detect the paste more directly. This involves modifying the apparatus by orienting the optical fibers so that they will point to the tips of the dispensing nozzles rather than being directed at the silver bus bars or soldering pads. With this second arrangement of the optical fibers, no reflected light will be sensed by sensing modules 174 when no paste is present at the nozzle tips. However, if solder paste emerges from a nozzle tip, light will be reflected back by the emerging solder and the associated sensing module will provide an output signal indicating that the associated pump has functioned properly. This second way is not preferred since the reflectivity of the solder paste is less than that of the silver bus bars and soldering pads. Consequently, monitoring the tips of the dispensing nozzles requires more amplifier gain or using a light beam of greater intensity in order to achieve the same degree of sensitivity achieved by monitoring the light reflected by the bus bars and soldering pads.

Also, it is contemplated that the turntable may be replaced by some other form of conveyor mechanism. Of course, the invention may be modified so as to apply solder paste to only one side of the cell, but that detracts from its production efficiency adapted to perform the same function. Still another obvious modification is to eliminate the optical monitoring mechanism, and instead rely on manual inspection of the cells after they have been unloaded. However, the optical inspection system offers the advantage that it automatically determines whether or not solder paste has been appropriately applied to the soldering pads 16 and the bus bars 8 of a solar cell.

Other advantages and modifications of the invention will be obvious to persons skilled in the art.

What is claimed is:

1. Apparatus for applying solder paste to an electrical contact on a solar cell for the purpose of facilitating soldering an electrical conductor to that contact, said apparatus comprising:

a conveyor having cell-holding means for holding a solar cell on which solder paste is to be deposited;

selectively operable means for moving said conveyor so as to sequentially (a) move said cell-holding means from a first cell-loading station to a second cell-pasting station, and (b) move said cell-holding means from said cell-pasting station to a cell-unloading station;

solder paste dispensing means disposed at said second cell-pasting station for dispensing paste onto selected surface areas of a solar cell disposed at said second cell-pasting station, said solder paste dispensing means comprising a plurality of dispensing nozzles and solder paste feed means operable on command to deliver solder paste to said dispensing nozzles under pressure whereby solder paste is discharged through each of said dispensing nozzles each time said solder paste feed means is operated; and operating means for operating said solder paste feed means each time a new cell is moved to said second cell-pasting station by said conveyor.

2. Apparatus according to claim 1 further including detection means for detecting when said solder paste feed means fails to operate to dispense solder paste.

3. Apparatus according to claim 2 further including means for commanding said operating means to operate said solder paste feed means again each time said detection means detects that said solder paste feed means has failed to dispense solder paste when operated.

4. Apparatus according to claim 1 wherein said solder paste feed means comprises at least one positive displacement pump adapted to dispense a limited quantity of solder paste each time said pump is operated.

5. Apparatus according to claim 4 further including means for detecting when said at least one pump fails to dispense solder paste.

6. Apparatus according to claim 5 further including means for commanding said operating means to operate said at least one pump each time said detection means detects that said at least one pump has failed to operate to dispense solder paste.

7. Apparatus according to claim 1 wherein said cell-loading station and said cell-unloading station are one and the same.

8. Apparatus for applying solder paste to an electrical contact on a solar cell for the purpose of facilitating soldering an electrical conductor to that contact, said apparatus comprising:
a turntable having cell-holding means for holding a solar cell on which solder paste is to be deposited;
means rotatably supporting said turntable;
selectively operable means for rotating said turntable so as to sequentially (a) move said cell-holding means from a cell-loading station to a cell-pasting station, and (b) move said cell-holding means from said cell-pasting station to a cell-unloading station;
solder paste dispensing means disposed at said second cell-pasting station for dispensing paste onto selected surface areas of a solar cell disposed at said cell-pasting station, said paste dispensing means comprising a plurality of dispensing nozzles and solder paste feed means operable on command to supply solder paste to said dispensing nozzles under pressure whereby said paste will be discharged from said dispensing nozzles, said solder paste feed means being adapted to dispense a limited quantity of solder paste through said dispensing nozzles each time said solder paste feed means is operated; and
operating means for operating said solder paste feed means each time a new cell is moved to said cell-pasting station by said turntable.

9. Apparatus according to claim 8 wherein said cell-unloading station and said cell-loading station are one and the same.

10. Apparatus according to claim 8 wherein said solder paste feed means comprises a plurality of pumps, one for each of said dispensing nozzles.

11. Apparatus according to claim 10 wherein said operating means for operating said solder paste feed means is adapted to operate all of said pumps simultaneously.

12. Apparatus according to claim 10 wherein said pumps are positive displacement pumps.

13. Apparatus according to claim 10 further including means for detecting when any of said pumps fails to dispense solder paste.

14. Apparatus according to claim 13 further including means for identifying any pump that fails to dispense solder paste.

15. Apparatus according to claim 8 wherein said solder paste feed means comprises a plurality of pumps, one for each dispensing nozzle, and said operating means is adapted to selectively operate each pump independently of each other pump.

16. Apparatus according to claim 8 for applying solder paste to the front and back contacts of solar cells of the type having a front contact comprising a plurality of narrow conductive metal fingers joined together by one or more conductive metal bus bars,
wherein said dispensing nozzles are arranged in an upper array for applying solder to said bus bars and a lower array for applying solder to said rear contact.

17. Apparatus according to claim 8 wherein said dispensing nozzles are mounted for movement toward and away from said turntable.

18. Apparatus according to claim 17 further including nozzle-moving means for moving said dispensing nozzles toward and away from said turntable.

19. Apparatus according to claim 18 further including control means for sequentially operating said turntable rotating means, said nozzle-moving means, and said solder paste feed means.

20. Apparatus according to claim 19 wherein said control means is adapted to sequentially (a) cause said turntable to rotate so as to transport a solar cell held by said cell-holding means from said cell-loading station to said cell-pasting station, (b) cause said nozzles to move toward said turntable into a predetermined confronting relation with said cell at said cell-pasting station, (c) cause said paste feed means to deliver paste through said dispensing nozzles onto at least one contact of said cell at said cell-pasting station, (d) cause said nozzles to move away from said cell at said cell-pasting station, and (e) thereafter cause said turntable to rotate so as to move said cell to said cell-unloading station.

21. Apparatus according to claim 8 wherein said solder paste feed means comprises at least one syringe for holding solder paste under pressure, and a pump communicating with the interior of said syringe for transporting a predetermined quantity of solder paste from said syringe to at least one of said dispensing nozzles each time said pump is operated.

22. Apparatus according to claim 8 for applying solder paste to the front and back contacts of solar cells of the type having a front contact comprising a plurality of narrow conductive metal fingers joined together by one or more conductive metal bus bars, and a rear contact covering most of the rear side of the cell,
wherein said nozzles are arranged in an upper array for applying solder paste to said bus bars and a lower array for applying solder paste to said rear contact, whereby when said solder paste feed means is operated, the nozzles in said upper array will apply solder to said bus bars and the nozzles in said lower array will apply solder to said rear contact; and said solder paste feed means comprises at least one syringe for holding solder paste under pressure, and a pump communicating with the interior of said syringe for transporting a predetermined quantity of solder paste from said syringe to at least one of said dispensing nozzles each time said pump is operated.

23. Apparatus according to claim 22 wherein the back contact of said cell has a plurality of soldering pads arranged in at least first and second rows that extend parallel to said bus bars, and said cell-holding means is adapted to hold a cell on said turntable so that (a) the plane of said cell is parallel to the plane of said turntable and (b) said first and second rows of soldering pads extend along parallel chords of the circle of revolution of said turntable with the axis of revolution of said turntable located between said chords.

24. Apparatus according to claim 23 further including a carriage for supporting said solder paste dispensing means, and drive means for moving said carriage bidirectionally relative to said turntable, said drive means being operable to move said carriage between a retracted position and an extended position, said extended position being such that said nozzles are disposed to supply solder paste to said first and second rows of soldering tabs of a cell in said cell-pasting station when said carriage is in said extended position, and said retracted position being such that said nozzles are withdrawn from any overlapping relation with said cell in said cell-pasting station when said carriage is in said retracted position.

25. Apparatus according to claim 24 wherein said carriage drive means is adapted to move said carriage bidirectionally from said retracted position to two different extended positions, and then back to said first retracted position, said two extended positions being such that said dispensing nozzles are disposed to (a) supply solder paste to selected tabs in said first and second rows of soldering tabs when in said extended position and third position and (b) supply solder paste to others of said soldering tabs when in the other of said extended positions.

26. Apparatus according to claim 22 wherein said solder paste feed means comprises a plurality of syringes each connected to a different one of said nozzles, and a plurality of pumps for transporting solder paste from said syringes to said nozzles, and further including means for repeating operation of any pump that fails to dispense solder paste when it is operated.

27. Apparatus according to claim 8 wherein said dispensing nozzles are movable into contact with a solar cell disposed at said cell-pasting station, and further including spring means for limiting the contact force exerted by said nozzles on said solar cell.

28. A method of applying solder paste to an electrical contact on a solar cell for the purpose of facilitating soldering an electrical conductor to that contact, said method comprising the steps of:

placing a solar cell on which solder paste is to be deposited on a conveyor having cell-holding means;

moving said conveyor so as to transport said cell-holding means to a cell-pasting station;

using a plurality of solder paste dispensing means at said cell-pasting station to dispense solder paste onto at least one side of said solar cell so that daubs of solder paste are deposited at a plurality of sites on said at least one side of said solar cell; and moving said conveyor so as to transport said cell-holding means from said cell-pasting station to a cell-unloading station; and unloading said solar cell from said cell-holding means at said cell-unloading station.

29. Method according to claim 28 further including the step of detecting when any of said solder paste dispensing means fails to dispense solder paste.

30. Method according to claim 28 wherein said solder paste dispensing means comprises a plurality of solder dispensing devices and a plurality of pumps each connected to feed solder paste on command to a different one of said dispensing devices, and further including the step of operating all of said pumps simultaneously so as to apply solder paste to said plurality of sites simultaneously.

31. Method according to claim 30 wherein said pumps are positive displacement pumps.

32. Method according to claim 30 further including the step of detecting when any of said pumps fails to operate to dispense solder paste.

33. Method according to claim 32 further including the step of identifying any pump that fails to dispense solder paste.

34. Method according to claim 30 wherein said dispensing nozzles are mounted for movement toward and away from said cell in said cell-pasting station, and further including the step of moving said nozzles toward said cell in said cell-pasting station when it is desired to dispense solder paste and moving said nozzles away from said cell in said cell-pasting station after solder paste has been dispensed onto said cell by said nozzles.

35. Method according to claim 28 wherein said plurality of solder paste dispensing means is arranged in first and second arrays, and said first and second arrays of dispensing means are used to dispense daubs of solder paste simultaneously onto the front and back sides respectively of said solar cell.

* * * * *